United States Patent
Aleshin et al.

(10) Patent No.: US 6,911,285 B2
(45) Date of Patent: Jun. 28, 2005

(54) SIDELOBE CORRECTION FOR ATTENUATED PHASE SHIFT MASKS

(75) Inventors: Stanislav Aleshin, Moscow (RU); Marina Medvedeva, Moscow (RU); Sergei Rodin, Moscow (RU)

(73) Assignee: LSI Logic Corporation, Milpitas, CA (US)

(*) Notice: Subject to any disclaimer, the term of this patent is extended or adjusted under 35 U.S.C. 154(b) by 104 days.

(21) Appl. No.: 10/327,451

(22) Filed: Dec. 20, 2002

(65) Prior Publication Data

US 2004/0121242 A1 Jun. 24, 2004

(51) Int. Cl.$^7$ ................................................ G03F 9/00
(52) U.S. Cl. ............................................................. 430/5
(58) Field of Search ...................... 430/5, 322; 716/19, 716/21; 359/500.2, 500.21

(56) References Cited

U.S. PATENT DOCUMENTS 6,214,497 B1 * 4/2001 Stanton .......................... 430/5

2004/0111693 A1 * 6/2004 Lin et al. ...................... 716/19

* cited by examiner

Primary Examiner—S. Rosasco
(74) Attorney, Agent, or Firm—Sawyer Law Group

(57) ABSTRACT

A method and system for simply and efficiently correcting sidelobe formation is disclosed. The method for reducing sidelobe formation in an aerial image created from an attenuated phase shift mask used in photolithography includes the steps of: a) generating a density map for an input design having a set of nodes identified as being outside of a periphery of the input design; b) examining the aerial image using the density map to compare an image intensity of the aerial image at a plurality of locations, each location corresponding to one node of the set of nodes; c) marking a node of the density map when the image intensity at the corresponding location of the aerial image satisfies a threshold intensity criterion and a separation distance criterion to create a set of marked nodes; and d) masking each node of the set of marked nodes.

15 Claims, 5 Drawing Sheets

FIG._1

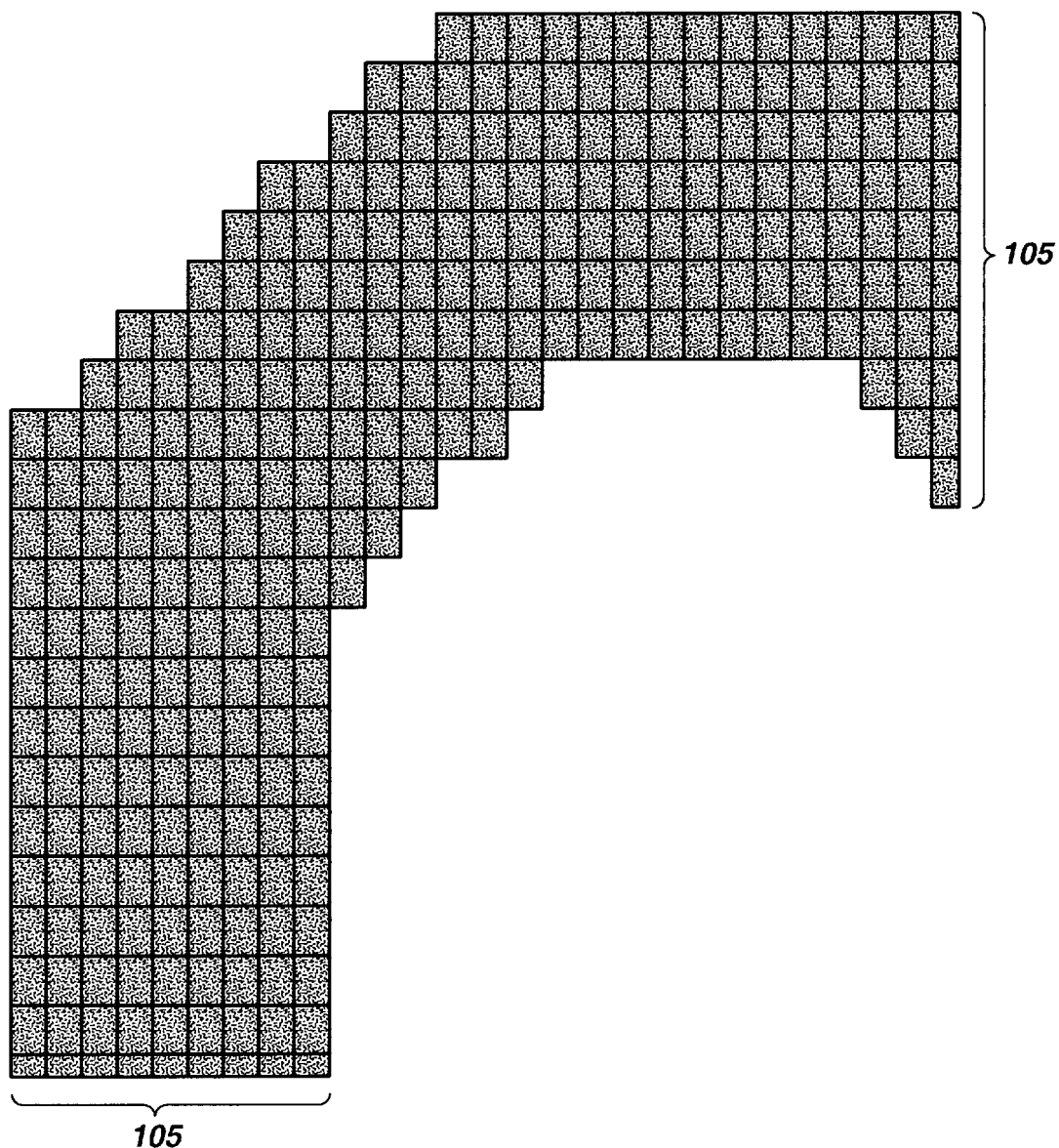
FIG._3

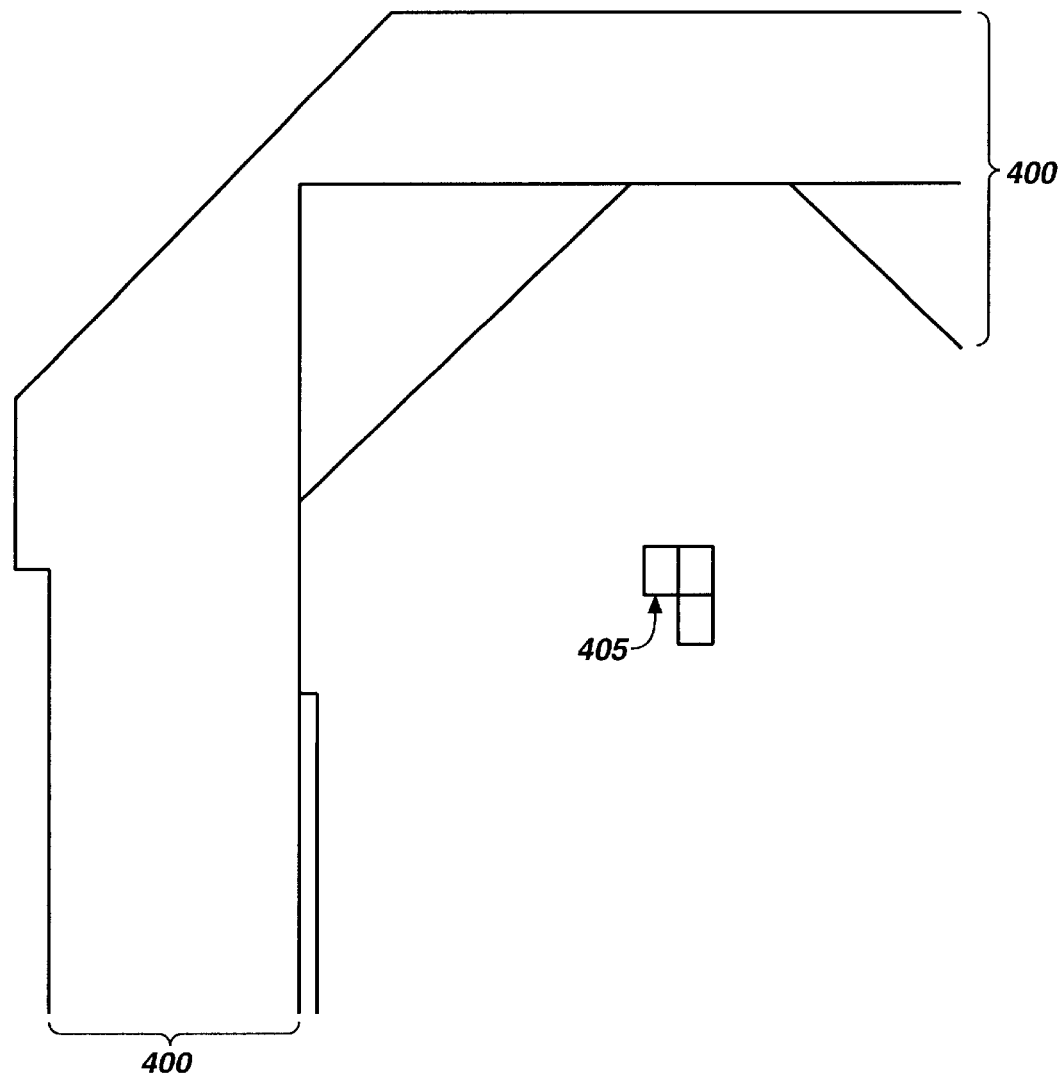
FIG._4

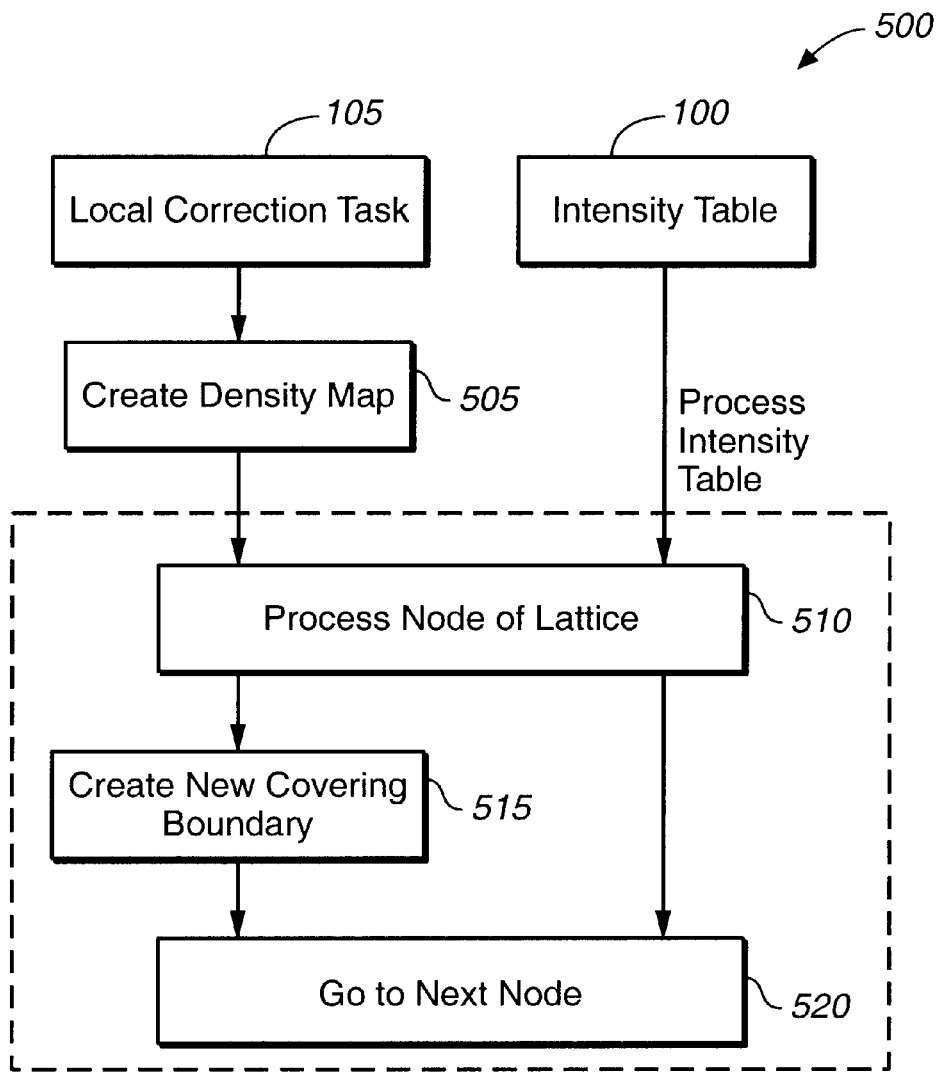
FIG._5

SIDELOBE CORRECTION FOR ATTENUATED PHASE SHIFT MASKS

FIELD OF THE INVENTION

The invention relates generally to reducing artifacts in aerial images used in photolithography and more particularly to reducing sidelobe formation in an aerial image created from an attenuated phase shift mask used in photolithography.

BACKGROUND OF THE INVENTION

Photolithography systems are well known in the art. For example, U.S. Pat. No. 6,171,731 (the '731 patent) issued to Medvedeva, et. al. entitled "Hybrid Aerial Image Simulation" provides a background for semiconductor fabrication procedures and Optical Proximity Correction (OPC). The specification of the '731 patent is hereby incorporated herein as though set forth in full by this reference.

During some photolithography tasks using attenuated phase shift masks, constructive interference produces what are known as sidelobes (or hotspots) in an aerial image. Sidelobes are unintended, errant, energy patterns that are undesirable because they produce unwanted structures during subsequent manufacturing processes. Therefore these sidelobes need to be removed or compensated for.

Accordingly, what is needed is a method and system for simply and efficiently correcting sidelobe formation. The present invention addresses such a need.

SUMMARY OF THE INVENTION

A method and system for simply and efficiently correcting sidelobe formation is disclosed. The method for reducing sidelobe formation in an aerial image created from an attenuated phase shift mask used in photolithography includes the steps of: a) generating a density map for the input design having a set of nodes identified as being outside of a periphery of the input design; b) examining the aerial image using the density map to compare an image intensity of the aerial image at a plurality of locations, each location corresponding to one node of the set of nodes; c) marking a node of the density map when the image intensity at the corresponding location of the aerial image satisfies a threshold intensity criterion and a separation distance criterion to create a set of marked nodes; and d) masking each node of the set of marked nodes.

BRIEF DESCRIPTION OF THE DRAWINGS

FIG. 3 is a schematic diagram of part of a density map;

FIG. 4 is a schematic diagram of a corrected input design with superimposition of a special sidelobe masking layer creating a set of one or more constructing boundaries; and FIG. 5 is a process flow chart of the preferred embodiment.

DETAILED DESCRIPTION

The invention relates generally to reducing artifacts in aerial images used in photolithography and more particularly to reducing sidelobe formation in an aerial image created from an attenuated phase shift mask used in photolithography. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Figure 1:
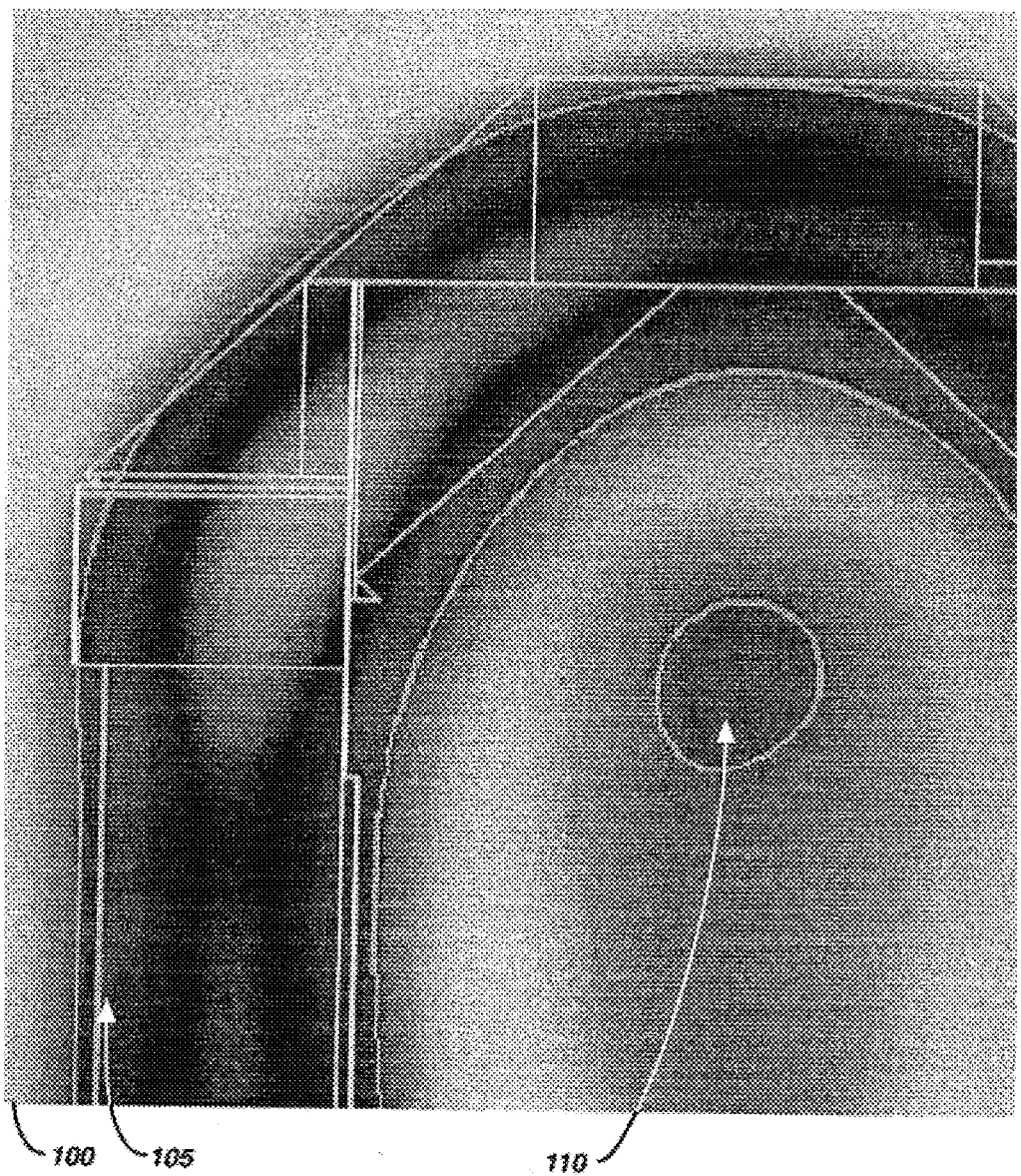
FIG. 1 is a schematic diagram of an aerial image.
Figure 2:
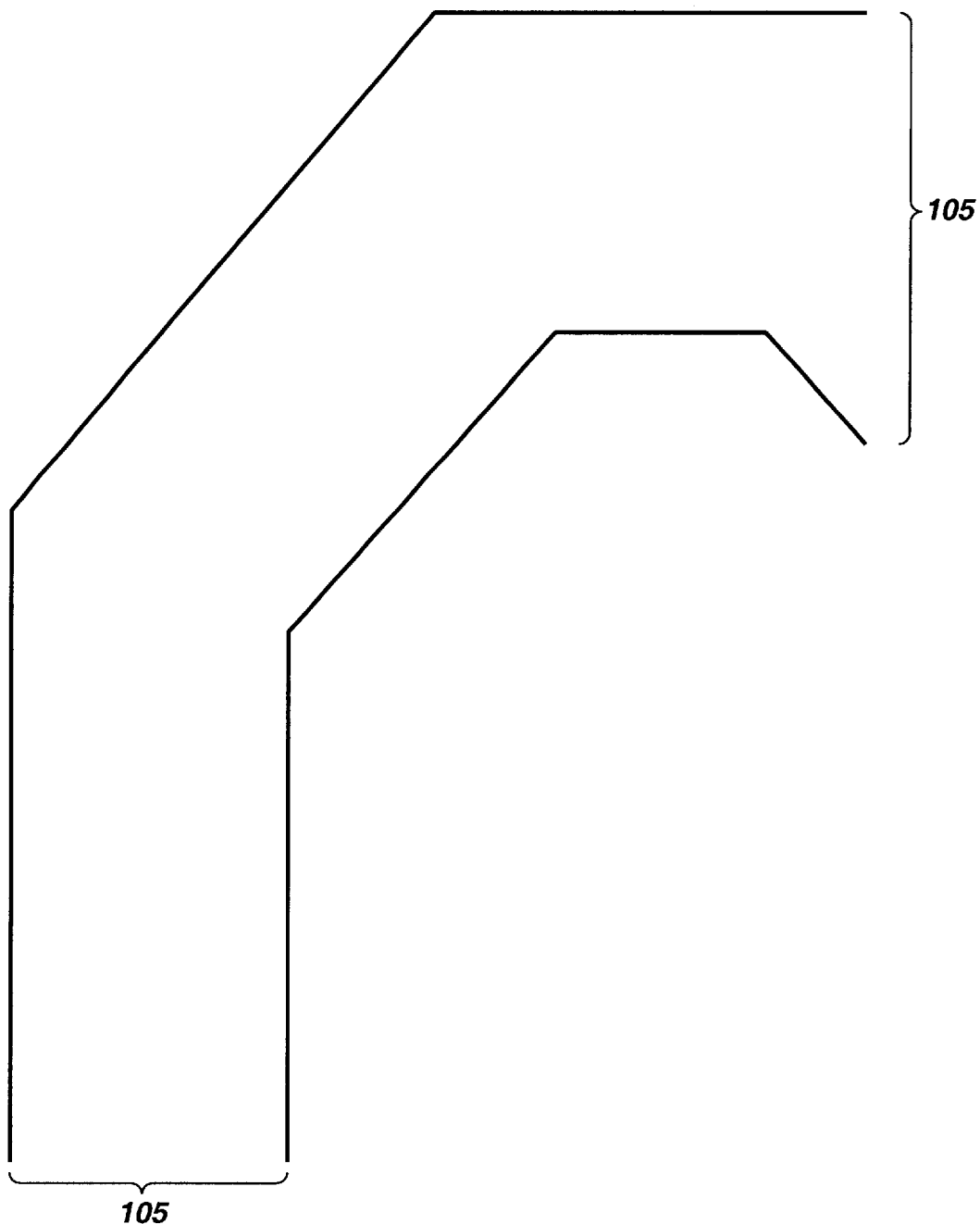
FIG. 2 is a schematic diagram of part of a local correction task (input design)

FIG. 1 is a schematic diagram of an aerial image 100. Image 100 is an intensity table (in the preferred embodiment image 100 is a lattice) after optical proximity correction (OPC). Image 100, as a lattice, is an array of nodes, each node containing an intensity value. Superimposed over image 100 is a portion of an input design 105 (local correction) and a sidelobe 110. FIG. 2 is a schematic diagram of part of a local correction task (input design) 105 that is desirably reproduced in aerial image 100. FIG. 3 is a schematic diagram of part of a density map 300 in which nodes inside input design 105 are marked. FIG. 4 is a schematic diagram of a corrected input design 400 with superimposition of a special sidelobe masking layer 405 that includes a set of one or more constructing boundaries that are produced by use of the preferred embodiment of the present invention. FIGS. 1–4 will be used to describe a preferred embodiment for the process flow of removing sidelobe 110.

FIG. 5 is a process flow chart of the preferred embodiment describing a sidelobe correction process 500. Process 500 has two inputs: a local correction task (e.g., input design 105) and an intensity table (e.g., aerial image 100) of the local correction task that has been optical proximity corrected. As discussed above, aerial image 100 is presented as the intensity table having an ordered array of nodes, each node containing an intensity value, with local correction 105 and intensity table 100 shown in FIG. 1.

Process 500 creates a density map 505 for local correction 105. Density map 505 is defined by having a process window covering local correction 105 (shown in FIG. 2) divided into an ordered array of rectangles using horizontal and vertical lines. Rectangles in the process window are marked if and only if a rectangle overlies (intersects) a portion of local correction 105. If there is no intersection of a rectangle of the process window with local correction 105, that particular rectangle is not marked. The set of rectangles are called the density map, each rectangle having a size corresponding to the sizes of the nodes of the lattice of aerial image 105. In the preferred embodiment, the correspondence is that the sizes of the rectangles match the sizes of the lattice nodes.

Process 500 next processes intensity table 100 at step 510 by examining each node (in the preferred embodiment, only nodes outside a periphery of local correction 105 are examined). The examination starts by comparing the intensity value contained in the node against a threshold value. If that intensity value exceeds the threshold value, all nodes in a neighborhood of the examined node are also examined in density map 505. Should any of those nodes in the neighborhood be marked, examination of the node stops and a new node is selected for examination. For the preferred embodiment, the neighborhood is four cells, though in some applications it may be desirable to have a greater or lesser neighborhood value. In an ordered array, all cells not on the periphery have eight nearest neighbors, one on each side, one on a top and a bottom, and one on each of four diagonals. This is a neighborhood of one. A neighborhood of two examines the nearest neighbors of the nearest neighbors of the examined cell.

For an examined node having an intensity exceeding the threshold and not having any marked cells in the neighborhood as tested with density map 505, a new boundary 515 is generated and centered at the position of the examined node. In the preferred embodiment, boundary 515 is rectangular and has a size equal to the size of the nodes of intensity table 100. Boundary 515 is positioned on a special masking layer that will be used in conjunction with local correction 105. After adding boundary 515 to the special layer, process 500 goes to the next unexamined node of intensity table 100 (step 520).

At the end of process 500, all nodes of intensity table 100 have been examined, with nodes having an intensity greater than a threshold value and located a sufficient distance from local correction 105 being used to construct a set of constructing boundaries 405 on a special masking layer as shown in FIG. 4. This special layer is used to block sidelobe 110.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for reducing sidelobe formation in an aerial image created from an attenuated phase shift mask used in photolithography, comprising the steps of:
   a) generating a density map for the input design having a set of nodes identified as being outside of a periphery of the input design;
   b) examining the aerial image using the density map to compare an image intensity of the aerial image at a plurality of locations, each location corresponding to one node of the set of nodes;
   c) marking a node of the density map when the image intensity at the corresponding location of the aerial image satisfies a threshold intensity criterion and a separation distance criterion to create a set of marked nodes; and
   d) masking each node of the set of marked nodes.

2. The method of claim 1 wherein the aerial image is a lattice array of nodes of equal size, with each node of the lattice including an intensity value, and wherein a size of the nodes of the set of nodes of the density map are scaled relative to a size of the nodes of the lattice array.

3. The method of claim 2 wherein the size of the nodes of the density map match the size of the nodes of the lattice array.

4. The method of claim 2 wherein the threshold intensity criterion is satisfied when the intensity value of a node of the lattice array exceeds a predetermined value.

5. The method of claim 2 wherein the separation distance criterion is satisfied when none of a neighborhood of nodes of the examined node intersects with the input design.

6. The method of claim 4 wherein the separation distance criterion is satisfied when none of a neighborhood of nodes of the examined node intersects with the input design.

7. The method of claim 5 wherein the density map is an ordered array of nodes with each non-exterior node having eight immediately adjacent nodes and wherein the neighborhood includes the adjacent nodes.

8. The method of claim 6 wherein the density map is an ordered array of nodes with each non-exterior node having a first set of eight immediately adjacent nodes and wherein the neighborhood includes the adjacent nodes.

9. The method of claim 7 wherein the neighborhood includes a second set of adjacent nodes, the second set of nodes including nodes immediately adjacent to the first set of adjacent nodes.

10. The method of claim 8 wherein the neighborhood includes a second set of adjacent nodes, the second set of nodes including nodes immediately adjacent to the first set of adjacent nodes.

11. The method of claim 9 wherein the neighborhood includes a third set of adjacent nodes, the third set of nodes including nodes immediately adjacent to the first set and the second set of adjacent nodes.

12. The method of claim 10 wherein the neighborhood includes a third set of adjacent nodes, the third set of nodes including nodes immediately adjacent to the first set and the second set of adjacent nodes.

13. The method of claim 11 wherein the neighborhood includes a fourth set of adjacent nodes, the fourth set of nodes including nodes immediately adjacent to the first set, the second set and the third set of adjacent nodes.

14. The method of claim 12 wherein the neighborhood includes a third set of adjacent nodes, the third set of nodes including nodes immediately adjacent to the first set, the second set and the third set of adjacent nodes.

15. A system for reducing sidelobe formation in an aerial image created from an attenuated phase shift mask used in photolithography, comprising:
   means for generating a density map for an input design having a set of nodes identified as being outside of a periphery of the input design;
   means for examining the aerial image using the density map to compare an image intensity of the aerial image at a plurality of locations, each location corresponding to one node of the set of nodes;
   means for marking a node of the density map when the image intensity at the corresponding location of the aerial image satisfies a threshold intensity criterion and a separation distance criterion to create a set of marked nodes; and
   means for masking each node of the set of marked nodes.

* * * * *